(12) United States Patent
Crouch et al.

(10) Patent No.: US 9,241,430 B2
(45) Date of Patent: Jan. 19, 2016

(54) POWER POLE ISOLATED HEAT PIPE INVERTER ASSEMBLY

(71) Applicant: Eaton Corporation, Cleveland, OH (US)

(72) Inventors: Jonathan Charles Crouch, Waynesville, NC (US); Irving Albert Gibbs, Mills River, NC (US); Wesley Byron Johnson, Fletcher, NC (US); Paul Thomas Murray, Horse Shoe, NC (US); Ron Carl Schueneman, Arden, NC (US)

(73) Assignee: EATON CORPORATION, Cleveland, OH (US)

( * ) Notice: Subject to any disclaimer, the term of this patent is extended or adjusted under 35 U.S.C. 154(b) by 79 days.

(21) Appl. No.: 14/226,860

(22) Filed: Mar. 27, 2014

(65) Prior Publication Data

US 2014/0268570 A1  Sep. 18, 2014

Related U.S. Application Data

(63) Continuation-in-part of application No. 13/834,332, filed on Mar. 15, 2013, now Pat. No. 9,148,985.

(51) Int. Cl.
*H05K 7/20* (2006.01)
*H01L 23/34* (2006.01)
*H01L 23/427* (2006.01)
*H01L 23/467* (2006.01)

(52) U.S. Cl.
CPC .......... *H05K 7/20936* (2013.01); *H01L 23/427* (2013.01); *H01L 23/467* (2013.01); *H01L 2924/0002* (2013.01); *H05K 7/20918* (2013.01)

(58) Field of Classification Search
CPC ...................................... H01L 23/34–23/4735
USPC .................................................. 361/600–679
See application file for complete search history.

(56) References Cited

U.S. PATENT DOCUMENTS 6,041,850 A * 3/2000 Esser et al. ............... 165/104.33
6,822,866 B2  11/2004 Fearing et al.
(Continued)

FOREIGN PATENT DOCUMENTS

WO   2014/149233 A1   9/2014

OTHER PUBLICATIONS

European Patent Office, "International Search Report and Written Opinion", PCT/US2015/016080, Jun. 2, 2015, 11 pp.

*Primary Examiner* — Zachary M Pape
(74) *Attorney, Agent, or Firm* — Eckert Seamans Cherin & Mellott, LLC; David C. Jenkins; Philip E. Levy

(57) ABSTRACT

A power pole inverter is provided. The power pole inverter includes a housing assembly, a capacitor assembly, a number of arm assemblies, a number of heat sinks, and a support assembly. The housing assembly includes a number of sidewalk. The housing assembly sidewalls defining an enclosed space. The capacitor assembly is coupled to the housing assembly. Each arm assembly includes a plurality of electrical components and a number of electrical buses. Each the electrical bus includes a body with terminals, each the terminal structured to be coupled to, and in electrical communication with, the capacitor assembly, each arm assembly including a neutral terminal. Each arm assembly is coupled to, and in electrical communication with, the capacitor assembly. The support assembly includes a non-conductive frame assembly. The support assembly is structured to support each the heat sink in isolation.

20 Claims, 6 Drawing Sheets

(56) References Cited

U.S. PATENT DOCUMENTS

| | | | |
|---|---|---|---|
| 2004/0012983 A1* | 1/2004 | Fearing et al. | 363/16 |
| 2010/0118493 A1* | 5/2010 | Huang et al. | 361/700 |
| 2011/0101907 A1 | 5/2011 | Borisov et al. | |
| 2011/0116241 A1 | 5/2011 | Miller et al. | |
| 2013/0100716 A1* | 4/2013 | Tong et al. | 363/37 |
| 2014/0076517 A1* | 3/2014 | Toth et al. | 165/67 |

* cited by examiner

POWER POLE ISOLATED HEAT PIPE INVERTER ASSEMBLY

CROSS REFERENCE TO RELATED APPLICATION

This application is a continuation-in-part application of and claims priority to U.S. patent application Ser. No. 13/834,332, filed Mar. 15, 2013, entitled POWER POLE INVERTER.

BACKGROUND OF THE INVENTION

1. Field of the Invention

The disclosed and claimed concept relates to power pole inverters and, more specifically, to a power pole inverter including a number of arm assemblies, each including a neutral terminal, wherein each neutral terminal is electrically isolated from the ground and a housing assembly.

2. Background Information

Adjustable Speed or Variable Frequency Drives (ASDs or VFDs) are commonly used to operate polyphase AC induction motors at any speed desired by the end user. The advantage of using VFDs include low starting currents, low torque shock on equipment coupled to the driven motor. They also allow sophisticated control of speed and torque profiles as required by end users. VFDs operate by taking either incoming AC or DC power, having a fixed frequency and voltage, and converting it to AC power having a voltage or current with variable amplitude and frequency.

A VFD drive includes a plurality of inverters and a converter which are electrically coupled through electrical buses and physically coupled through their respective modular bases. The inverters may share a common cooling system connected to the respective heat sinks of each component. That is, a VFD is made up of a plurality of inverter modules, which are connected to a converter module to create the VFD, wherein each of the above components is packaged in a relatively small unit having a cooling apparatus. Each of the inverters is made of a modular base, a heat sink or exchanger connected to the base having a plurality of power semiconductor switches, a power supply and a gate driver, thermally coupled thereto, a plurality of capacitors, a plurality of electrical buses connecting the power semiconductor switches to the capacitors, and an insulative medium which encases or covers some or all of the electrically live components, such as the electrical buses. It is further noted that the conductors wrapped around the heat sink, i.e. the conductors were U-shaped.

The inverters are, generally, assembled as follows. The semiconductor switches, power supply, gate driver, and other electrical devices, hereinafter "electrical components," are coupled to the heat sink or base element. The electrical components are coupled to a bus, or a number of electrical buses. The heat sink, number of electrical buses, and electrical components are then arranged in an open ended housing assembly. The housing assembly may abut the heat exchange assembly. Thus, the housing assembly is open on one end and otherwise encloses the heat sink and electrical components. The electrical devices associated with the Power Pole arm are encapsulated with an insulating potting compound such as, but not limited to, silicone based compound, and the potting compound is cured and forms part of the physical protection. Thus, the number of electrical buses, and electrical components are encased in the potting compound. Alternatively, a minor portion of a component could be exposed. Thus, all, or substantially all, of the components were enclosed.

SUMMARY OF THE INVENTION

The disclosed and claimed concept provides an arm assembly wherein the insulating material, hereinafter a "sealing compound," is applied to the electrical bus and to a limited number of electrical components. That is, the arm assembly includes a heat exchanger assembly, a plurality of electrical components thermally coupled to the heat exchanger assembly, and a number of electrical buses. A sealing compound is then applied to each electrical bus and to a limited number of the electrical components. Thus, a limited number of electrical components are substantially sealed from an atmosphere. The components that are not encased in the sealing compound may be repaired or replaced on site.

The arm assembly may be one of a number of arm assemblies that are part of a power pole inverter. The power pole inverter includes a support assembly, a number of capacitor sets, each capacitor set coupled to the support assembly, and a number of inverter assemblies. Each arm assembly is coupled to, and in electrical communication with, one capacitor set. As before, each arm assembly includes a heat exchanger assembly, a plurality of electrical components thermally coupled to the heat exchanger assembly, and a number of electrical buses. Each electrical component is coupled to, and in electrical communication with, a number of electrical buses. A encapsulating compound is then applied to each electrical bus and to a limited number of the electrical components. Thus, a limited number of electrical components are substantially sealed from an atmosphere. The components that are not encased in the sealing compound may be repaired or replaced on site.

The disclosed and claimed concept further provides for a power pole inverter including a housing assembly, a capacitor assembly, a number of arm assemblies, a number of heat sinks, and a support assembly. The housing assembly includes a number of sidewalls. The housing assembly sidewalls define an enclosed space. The capacitor assembly is coupled to the housing assembly. Each arm assembly includes a plurality of electrical components and a number of electrical buses. Each electrical bus includes a body with terminals wherein each terminal structured to be coupled to, and in electrical communication with, the capacitor assembly, and each arm assembly including a neutral terminal. Each arm assembly is coupled to, and in electrical communication with, the capacitor assembly. The support assembly includes a non-conductive frame assembly. The support assembly is structured to support each heat sink in isolation. Each heat sink is coupled to the frame assembly. Each arm assembly neutral terminal is coupled to, and in electrical communication with, an associated heat sink. In this configuration, each neutral terminal is electrically isolated from the housing assembly.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
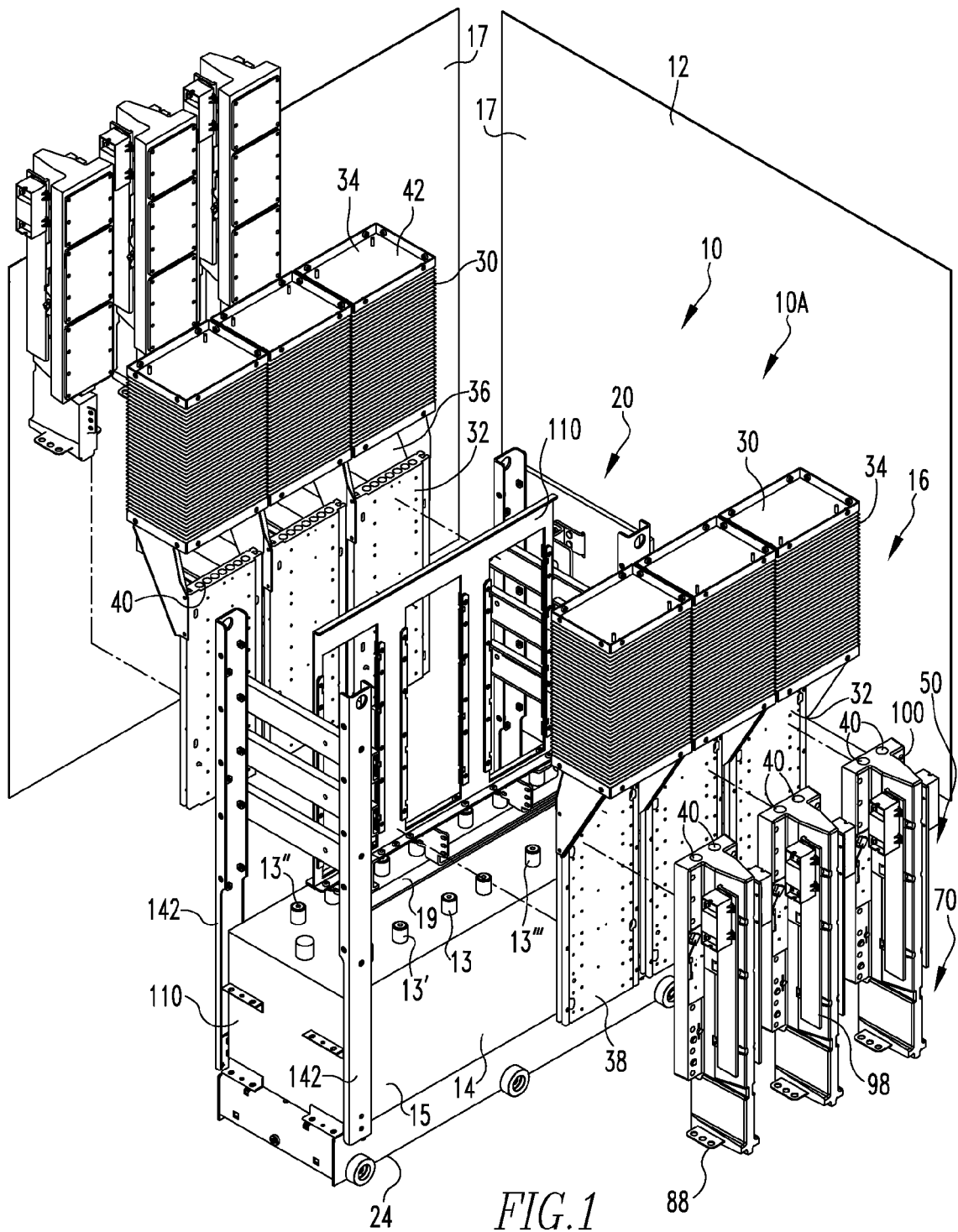
FIG. 1 is an isometric exploded view of a power pole inverter.

As used herein, the singular form of "a," "an," and "the" include plural references unless the context clearly dictates otherwise.

As used herein, the term "number" shall mean one or an integer greater than one (i.e., a plurality).

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other.

As used herein, a "coupling assembly" includes two or more couplings or coupling components. The components of a coupling or coupling assembly are generally not part of the same element or other component. As such, the components of a "coupling assembly" may not be described at the same time in the following description. Further, a "removable coupling assembly" is a coupling assembly wherein the components are easily separated, such as, but not limited to a nut and bolt.

As used herein, a "coupling" is one element of a coupling assembly. That is, a coupling assembly includes at least two components, or coupling components, that are structured to be coupled together. It is understood that the elements of a coupling assembly are compatible with each other. For example, in a coupling assembly, if one coupling element is a snap socket, the other coupling element is a snap plug.

As used herein, the statement that two or more parts or components "engage" one another shall mean that the parts exert a force against one another either directly or through one or more intermediate parts or components.

As used herein, the word "unitary" means a component is created as a single piece or unit. That is, a component that includes pieces that are created separately and then coupled together as a unit is not a "unitary" component or body.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are said to fit "snugly" together or "snuggly correspond." In that situation, the difference between the size of the components is even smaller whereby the amount of friction increases. If the element defining the opening and/or the component inserted into the opening are made from a deformable or compressible material, the opening may even be slightly smaller than the component being inserted into the opening. This definition is further modified if the two components are said to "substantially correspond." "Substantially correspond" means that the size of the opening is very close to the size of the element inserted therein. That is, not so close as to cause substantial friction, as with a snug fit, but with more contact and friction than a "corresponding fit," i.e. a "slightly larger" fit.

Directional phrases used herein, such as, for example and without limitation, top, bottom, left, right, upper, lower, front, back and derivatives thereof, relate to the orientation of the elements shown in the drawings and are not limiting upon the claims unless expressly recited therein.

As shown in FIG. 1, a power pole inverter 10 includes a housing assembly 12, a capacitor assembly 14, a number of arm assemblies 16 and a conductive output bus assembly 19. As shown, in an exemplary embodiment the housing assembly 12 includes a number of generally planar sidewalls 17, a fan assembly 18, a movable trolley 24, and an electrically isolating support assembly 20, as discussed in detail below. The housing assembly sidewalls 17 define an enclosed space 21. In an exemplary embodiment, the housing assembly sidewalls 17 define a parallelepiped. A number of housing assembly sidewalls 17 include vents (not shown) that allow air to pass into, and out of, the enclosed space 21. In an exemplary embodiment, the fan assembly 18 is disposed adjacent the vents. The fan assembly 18 includes a number of fan units 23. Each fan unit 23 is structured to move a fluid and, in an exemplary embodiment, air. The capacitor assembly 14 includes a number of capacitors (not shown) disposed within a housing 15. The capacitor assembly 14 includes a number of terminals 13 and, in an exemplary embodiment, a number of positive terminals 13', negative terminals 13'", and neutral terminals 13'" The capacitor assembly 14 is coupled to the housing assembly 12 and, in an exemplary embodiment, the bottom sidewall of the capacitor assembly housing 15 is the bottom wall of the housing assembly 12.

Figure 2:
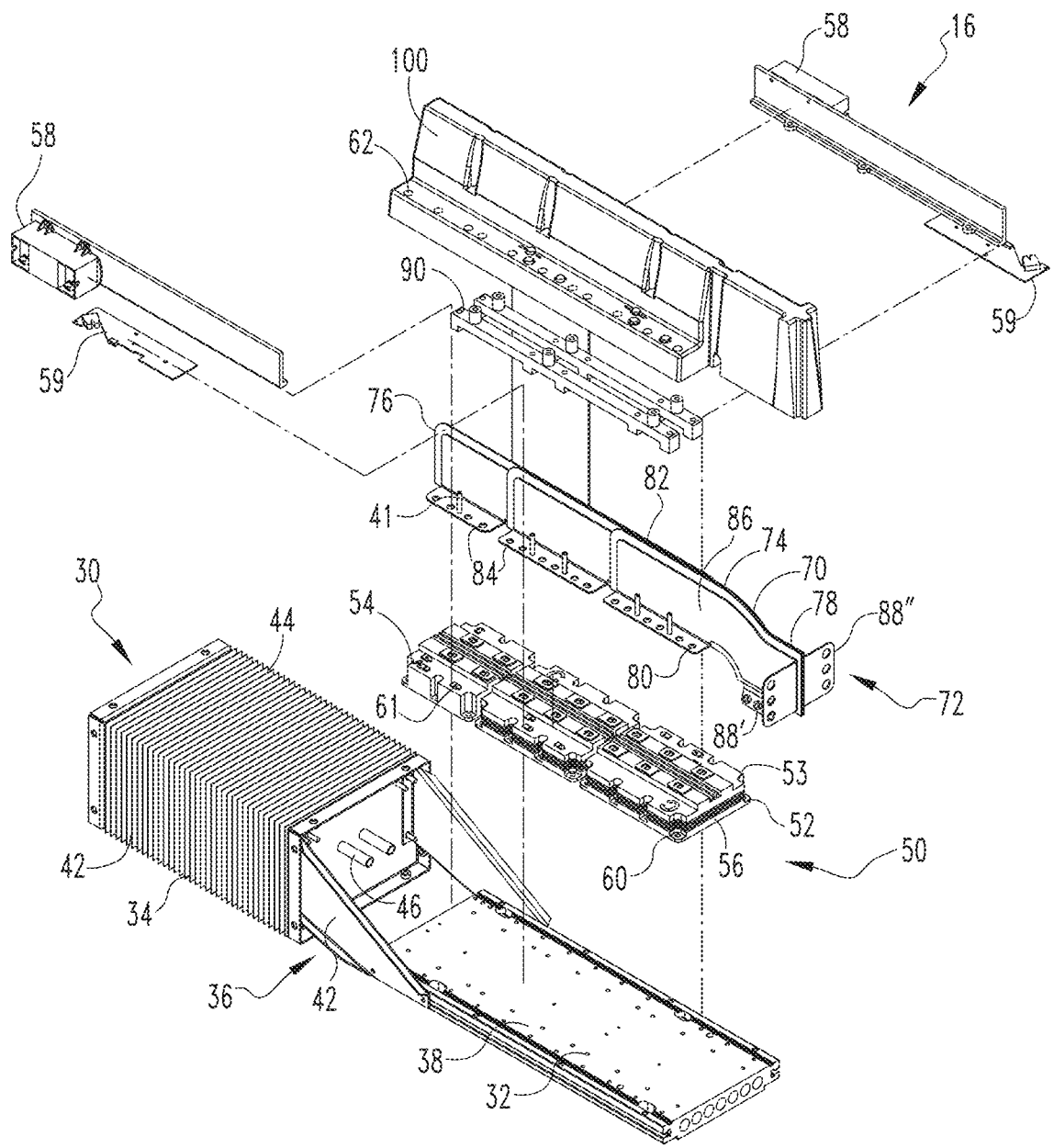
FIG. 2 is an isometric exploded view of an arm assembly.

Each arm assembly 16 is coupled to, and in electrical communication with, the capacitor assembly 14, as discussed below. As discussed below, an "arm assembly 16" may be a half-phase arm assembly or a full-phase arm assembly; the term "arm assembly" refers to either. Each arm assembly 16 includes a heat exchanger assembly 30, a plurality of electrical components 50, a number of electrical buses 70, and a sealing compound 100. The arm assemblies 16 are substantially similar and only one will be described. As shown in FIG. 2, heat exchanger assembly 30 includes a heat sink 32, a heat exchanger 34 and a number of fluid conduits 36. Heat sink 32 is, in an exemplary embodiment, a rectangular planar member 38 having a height, a width and a thickness. Heat sink planar member 38 includes a number of fluid passages 40. As shown, in an exemplary embodiment the heat sink fluid passages 40 are generally straight longitudinal passages that may be coupled to, and in fluid communication with, each other. Further, as each heat sink 32 supports the electrical components 50, the electrical buses 70, and the sealing compound 100, each heat sink 32 is also identified herein as part of the support assembly 20.

Each heat exchanger 34 is, in an exemplary embodiment, spaced from and disposed longitudinally above heat sink 32. Heat exchanger 34 is structured to dissipate heat and, in an exemplary embodiment, includes a condenser block 42 and a plurality of fins 44. As shown, condenser block 42 is a generally rectangular block that includes a number of internal passages (not shown). It is understood that the configuration of the heat exchanger condenser block 42 is not limited to this configuration, and may be modified in any shape or fashion so as to allow the optimal efficiency of the transfer of heat to the cooling medium. For example, condenser block 42 may be a number of tubular members (not shown) disposed in a block-like configuration and having a plurality of fins 44 coupled thereto. Fins 44 provide an additional thermal surface to increase the efficiency of the heat exchanger assembly 30.

Figure 4:
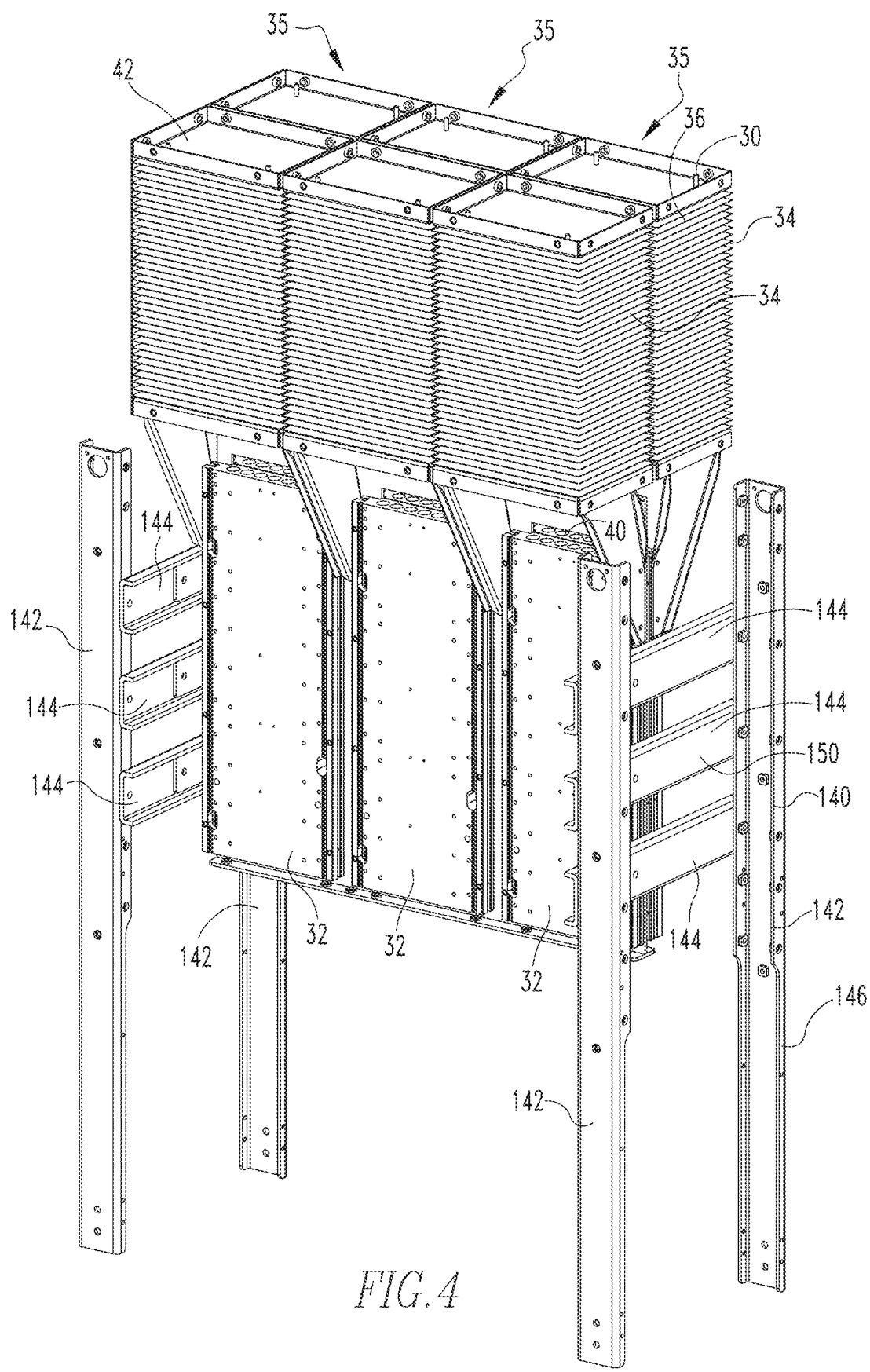
FIG. 4 is an isometric view of a frame assembly and support chassis.

As discussed below, the arm assemblies 16 are, in an exemplary embodiment, disposed in 3×2 matrix, as shown in FIG. 4. That is, in an exemplary embodiment, the arm assemblies 16 are disposed as three sets of adjacent pairs. In this configuration, each heat exchanger 34 is one part of an associated pair of heat exchangers 35. The pair of heat exchangers 35 includes a forward side 37 and rearward side 39, hereinafter heat exchanger forward side 37 and heat exchanger rearward side 39. It is understood that a fluid, i.e. air, passes through the pair of heat exchangers 35.

Fluid conduits 36 are coupled to, and in fluid communication with, both heat sink fluid passages 40 and condenser block passages. In this configuration, a fluid within heat sink fluid passages 40 can be transferred to condenser block passages wherein the fluid is cooled. In an exemplary embodiment, fluid conduits 36 and the fins 44 are made from a thermally conductive material, such as, but not limited to, aluminum, copper, etc. Thus, each heat sink 32 is operatively coupled to the heat exchanger 34 via the fluid conduits 36. As used herein with respect to a heat sink 32 and a heat exchanger 34, "operatively coupled" means that the two components are coupled in a manner that allows a heated fluid in the heat sink 32 to move into the heat exchanger 34.

As shown in FIG. 2, the plurality of electrical components 50 includes at least two components 50, one of which is enclosed within the encapsulating compound 100. The plurality of electrical components 50 includes transistors 52 and diodes 54. Transistor 52 is, in an exemplary embodiment, a generally planar semiconductor power switch 53 and is shown as an Insulated Gate Bipolar Transistor 56 (IGBT). The IGBT 56 includes a number of conductors (not shown) structured to be coupled to the other electrical components 50. Generally, the IGBT 56 is insulated from the heatsink assembly. A conductor of the IGBT 56 is coupled to a diode 54. The plurality of electrical components 50 also include, but is not limited to, a power supply 58 and a gate driver 59. It is understood that the IGBT 56 shown is only an exemplary component. The semiconductor power switch 53, such as IGBT 56, includes a generally planar body 60 having a length, width and thickness. The length and width of the semiconductor power switch 53 are both less than the length and width of the heat sink planar member 38.

The plurality of electrical buses 70 are structured to electrically couple the electrical components 50 to each other and to a capacitor assembly 14. The number of buses may include a plurality of buses, but as shown in an exemplary embodiment, a single elongated bus assembly 72 is used. Bus assembly 72 includes an elongated, generally planar body 74 having an upper, first end, 76, a lower, second end 78, a proximal side 80 and a distal side 82. In an exemplary embodiment, as shown, bus assembly body 74 includes a number of tabs 84. Tabs 84 extend generally normal to the plane of bus assembly body 74 and are disposed at bus body proximal side 80. In an exemplary embodiment, tabs 84 are portions of L-shaped conductive bodies 86 that are coupled or fixed to, and in electrical communication with, bus assembly body 74. It is understood that bus assembly 72 may also be a unitary body (not shown). Tabs 84 are structured to be coupled to, and in electrical communication with, electrical components 50 and the capacitor assembly 14. That is, when arm assembly 16 is assembled, bus assembly 72 is coupled to, and in electrical communication with, IGBT 56, power supply 58 and gate driver 59, as well as the capacitor assembly 14.

Each bus assembly 72 further includes a number of mounting tabs or terminals 88. Each mounting terminal 88 is coupled to, and in electrical communication with, bus assembly body 74. In an exemplary embodiment, each mounting terminal 88 is unitary with the bus assembly body 74. In an exemplary embodiment, there are two mounting terminals 88', 88" that extend in opposing directions and normal to the plane of the bus assembly body 74. Each mounting terminal 88 is structured to be coupled to, and in electrical communication with, a capacitor assembly terminal 13. Further, each neutral terminal, i.e. a mounting terminal 88 coupled to and electrical communication with a capacitor assembly neutral terminals 13''', is further coupled to the associated heat sink 32 by a conductor (not shown) such as, but not limited to a conductive cable.

The heat exchanger assembly 30, plurality of electrical components 50 (in the exemplary embodiment IGBT 56), and electrical buses 70 are assembled as follows. IGBT 56 is coupled to, or directly coupled to, heat sink planar member 38 with the planes of IGBT 56 and heat sink planar member 38 being generally parallel. That is, a broad, flat side of IGBT planar body 60 is coupled to, or directly coupled to, a broad flat side of heat sink planar member 38. IGBT 56 and heat sink planar member 38 each include a coupling assembly 41. In an exemplary embodiment, heat sink coupling assembly 41 is a plurality of nuts and bolts as well as a number of passages 61 through IGBT 56 and heat sink planar member 38. IGBT planar body 60 is disposed adjacent to, or on, heat sink planar member 38 with the coupling assembly 41 extending through the passages 61 in IGBT planar body 60 and sink planar member 38. Bus assembly 72 is then coupled to IGBT 56, and in an exemplary embodiment with a diode 54 disposed therebetween. The encapsulating compound 100 is applied using known processes, over and about the electrical components 50 in such a manner as to substantially penetrate all, or almost all of the air pockets and gaps in and/or around the electrically active devices. Each arm assembly 16 is then coupled to the support assembly 20 as described below.

Figure 3:
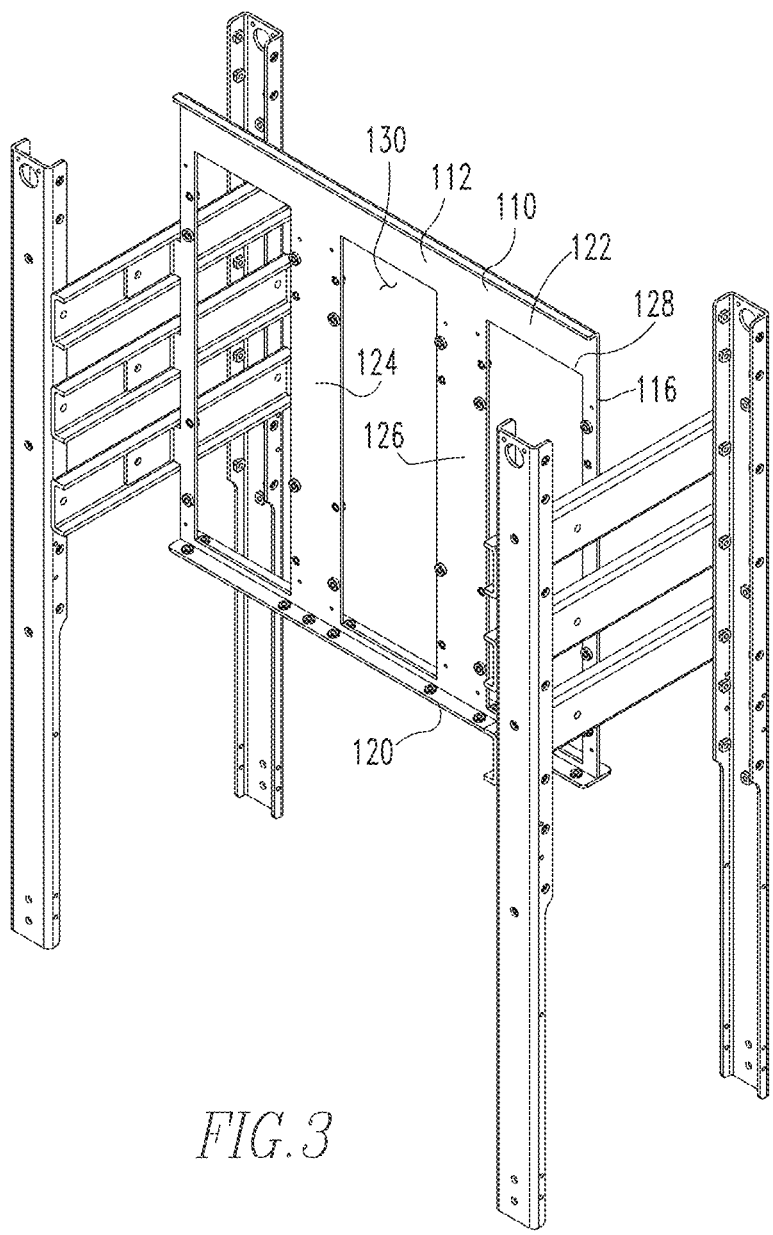
FIG. 3 is an isometric view of a frame assembly.
Figure 5:
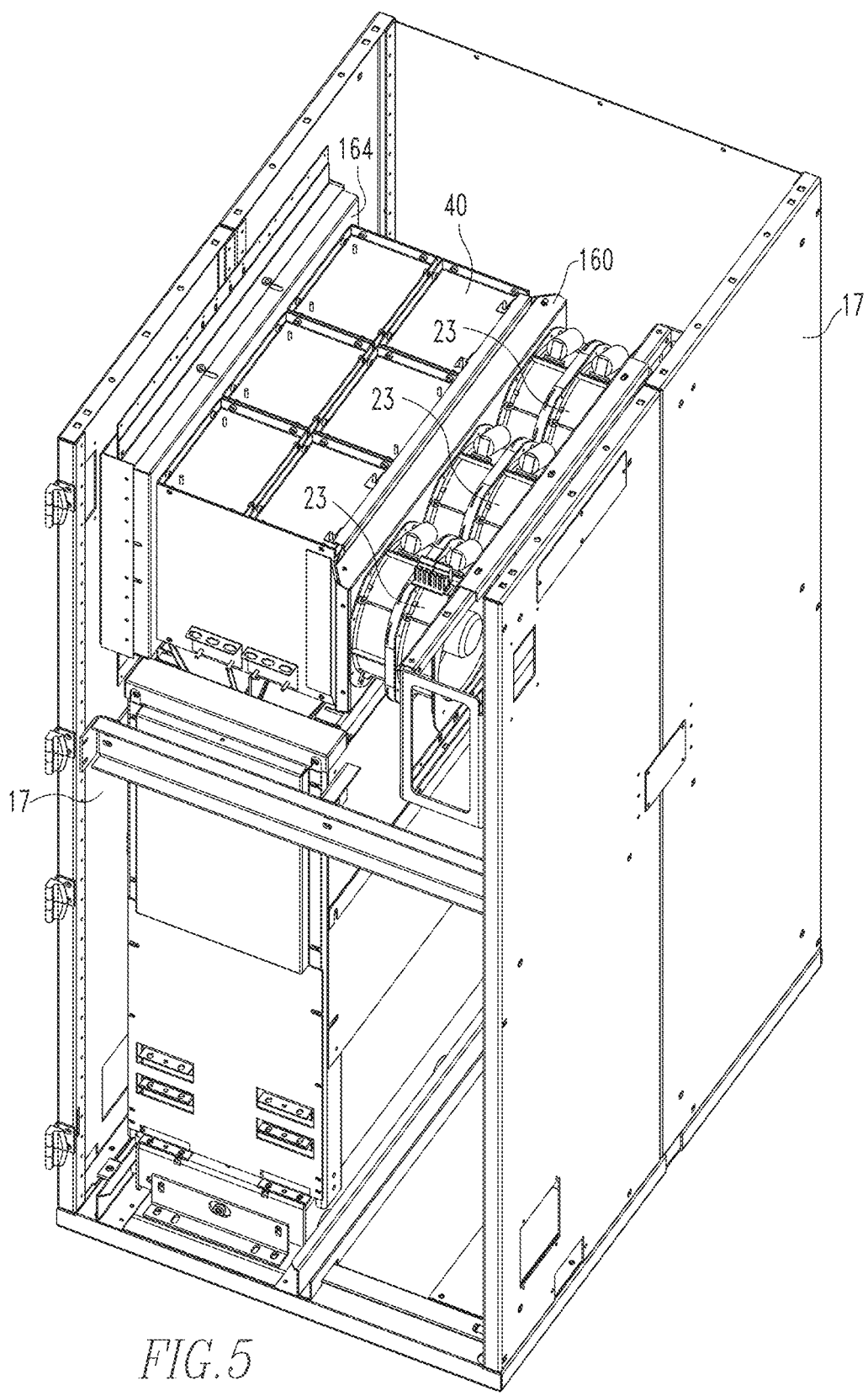
FIG. 5 is an isometric view of a heat exchanger isolation assembly.
Figure 6:
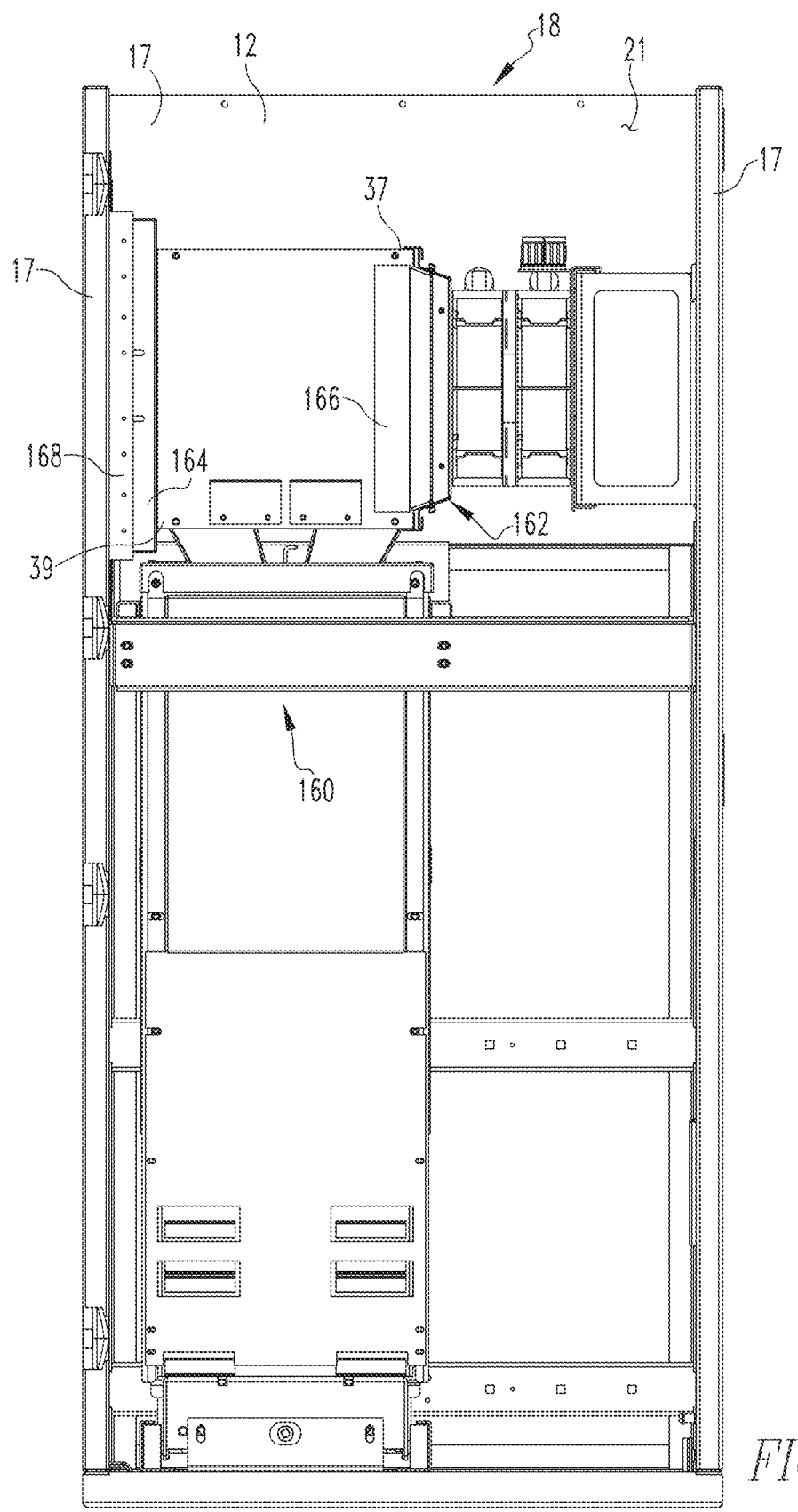
FIG. 6 is a side view of a heat exchanger isolation assembly.

The support assembly 20 is structured to electrically isolate each arm assembly 16 from the housing assembly 12 and the ground. In an exemplary embodiment, the support assembly 20 includes a non-conductive frame assembly 110, as shown in FIG. 3, a chassis 140, as shown in FIG. 4, and a heat exchanger isolation assembly 160, as shown in FIGS. 5 and 6. As shown in FIG. 3, the frame assembly 110 includes a body 112 made from a non-conductive material and, in an exemplary embodiment, from fiberglass reinforced polymer or alternate insulating material. The frame assembly body 112 includes two generally vertical posts 114, 116, disposed in a spaced relation, and two spaced generally horizontal members 120, 122. The horizontal members 120, 122 extend between and are coupled to, or unitary with, the posts 114, 116. Further, the frame assembly body 112 includes dividers 124, 126 extending between the horizontal members 120, 122. The dividers 124, 126 are positioned so as to define three cavities 130 sized to generally correspond to a heat sink 32. The frame assembly body 112 may include a number of positioning elements (not shown), e.g. planar tabs, disposed about the cavities 130 structured to support a heat sink 32. That is, the positioning elements generally align a heat sink 32 with a cavity 130 and support the heat sink 32 when the heat sink 32 is coupled to the frame assembly body 112. Further, the frame assembly body 112 maintains the heat sinks 32 in isolation. That is, as used herein, "isolation" means that the heat sinks 32 do not contact each other or any component that is grounded, e.g. the housing assembly 12.

As shown in FIG. 4, the chassis 140 includes a number of stanchions 142 and a number of non-conductive cross-members 144. In an exemplary embodiment, the stanchions 142 are non-conductive as well. Each stanchion 142 includes an elongated body 146 disposed generally vertically. In an exemplary embodiment, the number of stanchions 142 includes four stanchions 142 disposed in a rectangular pattern. As used herein, "in a rectangular pattern" means that the four stanchions 142 are disposed so as to define two pairs of generally parallel planes wherein there are two close pairs of stanchions 142. That is, when the stanchions 142 are disposed "in a rectangular pattern" it is inherent that there are two close pairs of stanchions 142.

Each cross-member 144 includes an elongated non-conductive body 150. Each cross-member 144 is coupled to, and extends between, a close pairs of stanchions 142. In an exemplary embodiment, there are six cross-members 144 with three cross-members 144 coupled to, and extending between, each close pair of stanchions 142. In an exemplary embodiment, each cross-member 144 is made from one of fiberglass reinforced polymer or an insulating material.

As shown in FIGS. 5 and 6, the heat exchanger isolation assembly 160 is structured to isolate each heat exchanger 42. In an exemplary embodiment, the heat exchanger isolation assembly 160 includes a non-conductive duct 162 and a non-conductive shroud 164. The duct 162 includes a body 166 defining a passage (not shown). The duct 162 is sized to correspond to the perimeter of the number of pairs of heat exchangers 35. That is, the duct 162 is sized to extend about the forward side 37 of the number of pairs of heat exchangers 35. Similarly, the shroud 164 includes a body 168 defining a passage (not shown) and is also sized to correspond to the perimeter of the number of pairs of heat exchangers 35. That is, the shroud 164 is sized to extend about the rearward side 39 of the number of pairs of heat exchangers 35. The duct body 166 and the shroud body 168 are, in an exemplary embodiment, made from one of polypropylene or polycarbonate.

The support assembly 20 is assembled as follows. The stanchions 142 are coupled to the capacitor assembly housing 15 and extend upwardly therefrom. The frame assembly 110 is coupled to the chassis 140 and, in an exemplary embodiment, the vertical posts 114, 116 are coupled to a cross-member center portion 150. Thus, the frame assembly 110 is generally centrally disposed within the rectangular pattern of stanchions 142. The arm assemblies 16 are then coupled to the frame assembly 110 with each heat sink 32 aligned with a cavity 130. In an exemplary embodiment, there are three arm assemblies 16 disposed on each side of the frame assembly 110, thus forming the 3×2 matrix noted above. It is further noted that the frame assembly 110 maintains the opposing heat sinks 32 in a spaced relation The heat exchanger isolation assembly 160 is then coupled to the number of heat exchangers 35 as noted above. That is, the duct 162 is coupled to, and extends about, the forward side 37 of the number of pairs of heat exchangers 35, and, the shroud 164 is coupled to, and extends about, the rearward side 39 of the number of pairs of heat exchangers 35. Further, the duct 162 is coupled to the fan assembly 18 and the shroud 164 is coupled to a housing assembly sidewalls 17 at a vent. Further, each arm assembly neutral terminal 13''' is coupled to, and placed in electrical communication with, the associated heat sink 32, i.e. the heat sink to which the neutral terminal's 13''' arm assembly 16 is coupled.

In this configuration, each heat sink 32 is isolated via the frame assembly 110 and the heat exchanger isolation assembly 160. That is, as used herein, "isolated via the frame assembly 110 and the heat exchanger isolation assembly 160" means that there is no conductive path between the heat sink 32 and the housing assembly 12 or the ground due to the non-conductive nature of the frame assembly 110 and the heat exchanger isolation assembly 160. Stated alternately, while each heat sink 32 is coupled to the housing assembly 12, and therefore the ground, via the frame assembly 110 and the heat exchanger isolation assembly 160, the non-conductive nature of the frame assembly 110 and the heat exchanger isolation assembly 160 eliminates any current path between each heat sink 32 and the housing assembly 12, and therefore the ground. It is further noted that the non-conductive cross-members 144 of the chassis 140 further ensure that there is no current path between each heat sink 32 and the housing assembly 12, and therefore the ground.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A support assembly for a power pole inverter, said power pole inverter including a housing assembly, a capacitor assembly, a number of arm assemblies, each arm assembly including a plurality of electrical components, a number of heat sinks, and a number of electrical buses, each said electrical bus including a body with terminals, each said terminal structured to be coupled to, and in electrical communication with, said capacitor assembly, each arm assembly including a neutral terminal, each arm assembly coupled to, and in electrical communication with, said capacitor assembly, wherein said support assembly comprises:
   a non-conductive frame assembly;
   said frame assembly structured to support each said heat sink in isolation;
   each heat sink coupled to said frame assembly; and
   wherein each heat sink is structured to be coupled to, and in electrical communication with, an associated arm assembly neutral terminal.

2. The support assembly of claim 1 further comprising:
   a chassis;
   said chassis including a number of stanchions and a number of non-conductive cross-members;
   each said cross-member coupled to, and extending between, a pair of stanchions;
   each said stanchion coupled to, and extending upwardly from, said capacitor assembly; and
   said frame assembly coupled to said cross-members.

3. The support assembly of claim 2 wherein:
   said number of stanchions includes four stanchions disposed in rectangular pattern; and
   each said cross-member coupled to, and extending between, each close pair of stanchions.

4. The support assembly of claim 3 wherein:
   the number of cross-members includes six cross-members; and
   wherein three cross-members are coupled to, and extend between, each close pair of stanchions.

5. The support assembly of claim 3 wherein:
   each cross-member includes a center portion; and
   said frame assembly coupled to said cross-members at said cross-member center portion.

6. The support assembly of claim 2 wherein each cross-member is made from one of fiberglass reinforced polymer or an insulating material.

7. The support assembly of claim 1 wherein said housing assembly includes a fan assembly and each said arm assembly includes a heat exchanger assembly including a heat exchanger, and wherein said support assembly further comprises a heat exchanger isolation assembly structured to isolate each said heat exchanger.

8. The support assembly of claim 7 wherein said heat exchangers are disposed in aligned pairs, each said pair of heat exchangers including a forward side and rearward side, and wherein:
said heat exchanger isolation assembly including a non-conductive duct and a non-conductive shroud;
said duct structured to be disposed between said fan assembly and said heat exchanger forward side; and
said shroud structured to be disposed between said heat exchanger rearward side and said housing assembly sidewalls.

9. The support assembly of claim 7 wherein said duct and said shroud are made from one of polypropylene or polycarbonate.

10. The support assembly of claim 7 wherein each said heat sink is isolated via said frame assembly and said heat exchanger isolation assembly.

11. A power pole inverter comprising:
a housing assembly including a number of sidewalls, said housing assembly sidewalls defining an enclosed space;
a capacitor assembly, said capacitor assembly coupled to said housing assembly;
a number of arm assemblies, each arm assembly including a plurality of electrical components and a number of electrical buses;
each said electrical bus including a body with terminals, each said terminal structured to be coupled to, and in electrical communication with, said capacitor assembly, each arm assembly including a neutral terminal;
each arm assembly coupled to, and in electrical communication with, said capacitor assembly;
a number of heat sinks;
a support assembly including a non-conductive frame assembly;
said support assembly structured to support each said heat sink in isolation;
each heat sink coupled to said frame assembly;
each arm assembly neutral terminal coupled to, and in electrical communication with, an associated heat sink; and
wherein each said neutral terminal is electrically isolated from said housing assembly.

12. The power pole inverter of claim 11 wherein:
said support assembly including a chassis;
said chassis including a number of stanchions and a number of non-conductive cross-members;
each said cross-member coupled to, and extending between, a pair of stanchions;
each said stanchion coupled to, and extending upwardly from, said capacitor assembly; and
said frame assembly coupled to said cross-members.

13. The power pole inverter of claim 12 wherein:
said number of stanchions includes four stanchions disposed in rectangular pattern; and
each said cross-member coupled to, and extending between, each close pair of stanchions.

14. The power pole inverter of claim 13 wherein:
the number of cross-members includes six cross-members; and
wherein three cross-members are coupled to, and extend between, each close pair of stanchions.

15. The power pole inverter of claim 13 wherein:
each cross-member includes a center portion; and
said frame assembly coupled to said cross-members at said cross-member center portion.

16. The power pole inverter of claim 12 wherein each cross-member is made from one of fiberglass reinforced polymer or alternate insulating material.

17. The power pole inverter of claim 11 wherein:
said housing assembly includes a fan assembly;
each said arm assembly includes a heat exchanger assembly including a heat exchanger;
said support assembly includes a heat exchanger isolation assembly structured to isolate each said heat exchanger; and
said heat exchanger isolation assembly coupled to, and disposed between said housing assembly sidewalls and said heat exchanger and between said heat exchanger and said fan assembly.

18. The power pole inverter of claim 17 wherein:
said heat exchangers are disposed in aligned pairs, each said pair of heat exchangers including a forward side and rearward side;
said heat exchanger isolation assembly including a non-conductive duct and a non-conductive shroud;
said duct structured to be disposed between said fan assembly and said heat exchanger forward side; and
said shroud structured to be disposed between said heat exchanger rearward side and said housing assembly sidewalls.

19. The power pole inverter of claim 17 wherein said duct and said shroud are made from one of polypropylene or polycarbonate.

20. The power pole inverter of claim 17 wherein each said heat sink is coupled to said housing assembly exclusively via said frame assembly and said heat exchanger isolation assembly.

* * * * *